United States Patent [19]
Russo

[11] 4,356,405
[45] Oct. 26, 1982

[54] FAIL-OFF PHOTOSENSITIVE SWITCH

[75] Inventor: John G. Russo, Middletown, Conn.

[73] Assignee: Ripley Company, Inc., Cromwell, Conn.

[21] Appl. No.: 114,372

[22] Filed: Jan. 21, 1980

[51] Int. Cl.³ .......................................... H01H 43/30
[52] U.S. Cl. .................................. 307/117; 315/159; 328/2; 361/175
[58] Field of Search ........................... 307/117; 328/2; 361/175; 315/159

[56] References Cited

U.S. PATENT DOCUMENTS

| | | | |
|---|---|---|---|
| 3,277,280 | 10/1966 | Staples et al. | 361/175 X |
| 3,294,974 | 12/1966 | Riebs | 315/159 X |
| 3,361,931 | 1/1968 | Vollrath | 328/2 X |
| 3,529,214 | 9/1970 | Corn | 307/117 X |

Primary Examiner—G. Z. Rubinson
Assistant Examiner—James L. Dwyer
Attorney, Agent, or Firm—DeLio and Libert

[57] ABSTRACT

A photosensitive switch including control means for turning a load on or off in response to the ambient light level. The switch is so arranged to turn the load off if the components thereof fail.

1 Claim, 4 Drawing Figures

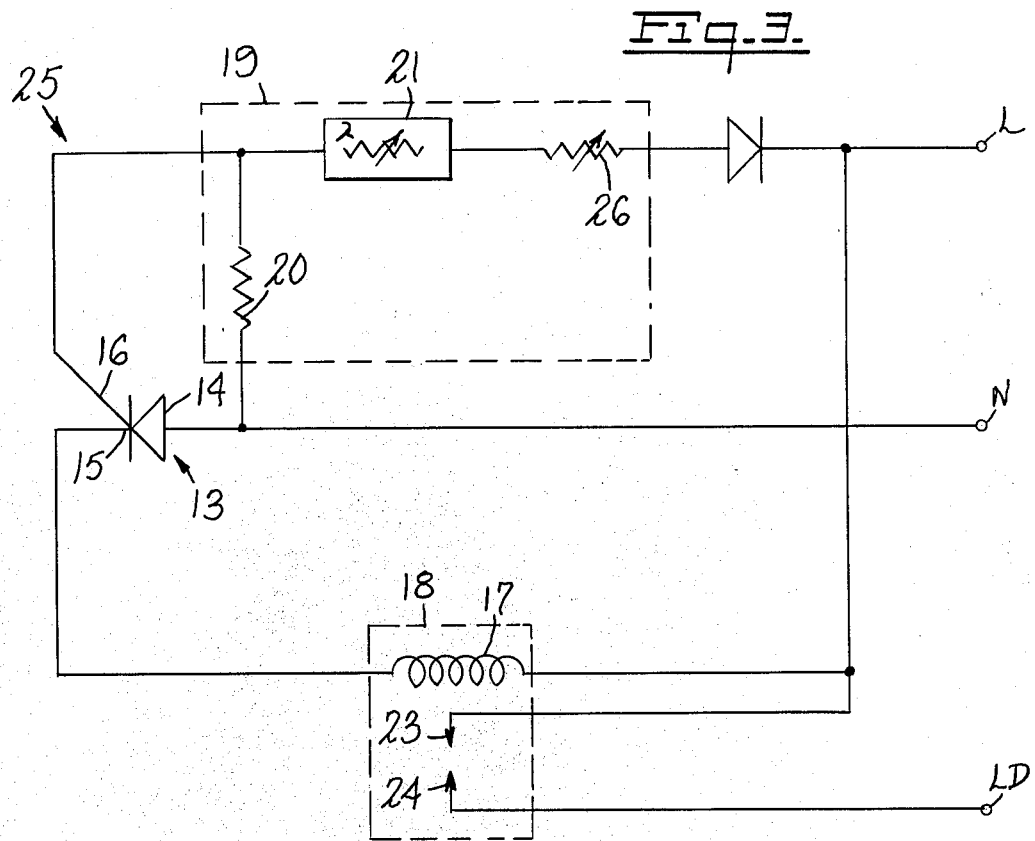
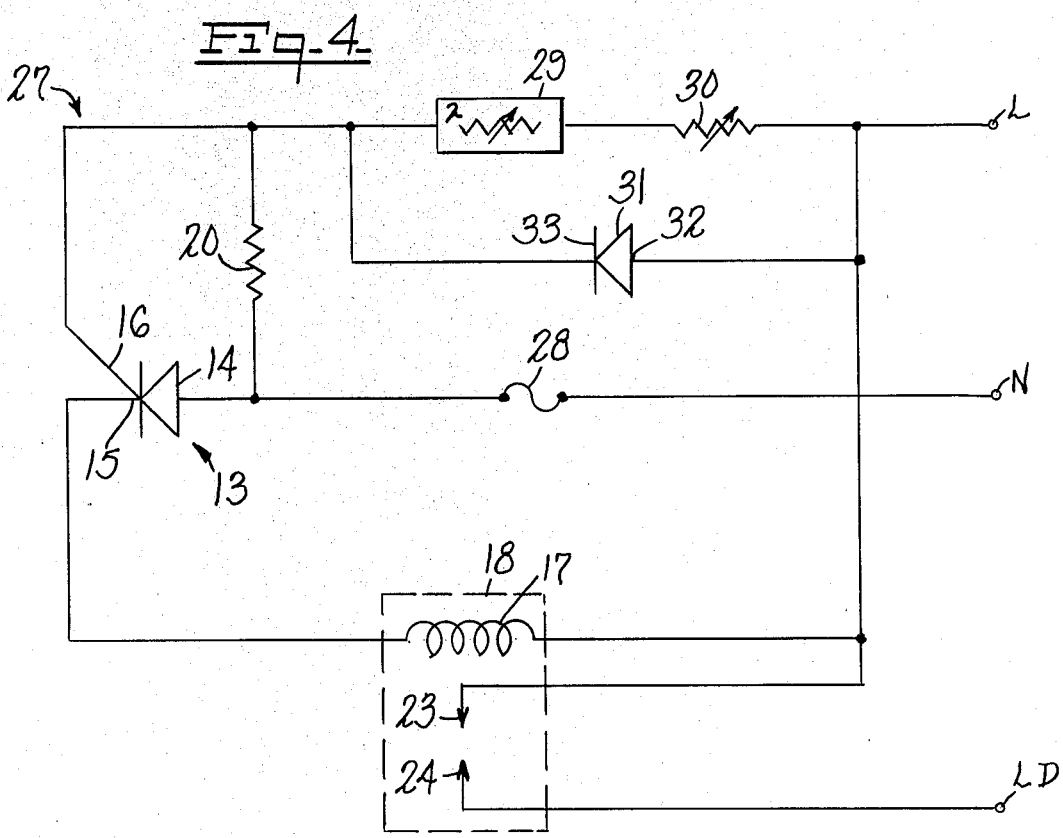

FAIL-OFF PHOTOSENSITIVE SWITCH

BACKGROUND OF THE INVENTION

1. Field of the Invention

This invention relates generally to the field of light actuated electronic switches, and specifically to such switches used in conjunction with outside loads such as street lamps or the like.

2. Description of the Prior Art

Light actuated switching devices employing thermal relays are known in the prior art. However, such devices waste energy by consuming substantial amounts of power during the daylight hours. Furthermore, such switches waste energy by being so arranged that, should the switch fail, it will most probably fail with the load on. During times of abundant energy, in the case of street lighting, in the interest of safety it was preferable to require the switch to fail with the light on.

With the energy crisis, however, it is desirable to provide a switch which consumes considerably less power than switches heretofore, typically on the order of milliwatts during the daylight hours and is so arranged so that the unit will turn the load off if any of the components of the switch fail.

SUMMARY OF THE INVENTION

The invention provides a switch for turning a load on or off including control means responsive to the ambient light level. In a first embodiment, a silicon controlled rectifier is arranged to actuate a thermal relay. The SCR in turn is connected to be switched on or off by a voltage divider network having a photosensitive resistor in one leg thereof, and a fixed resistor in the other. The ratios of the photosensitive resistor to the fixed resistor are such that during the night the SCR is permitted to pass current but during the day, the SCR effectively blocks current.

In a second embodiment, means are provided to vary the light sensitivity of the switch.

In a third embodiment, means are provided to turn the switch off if the SCR shorts.

It is therefore an object of the invention to provide a photosensitive switch having a reduced power consumption.

It is another object to provide a switch that most likely fails with current "off".

BRIEF DESCRIPTION OF THE DRAWINGS

The features of the invention which are believed to be novel are particularly pointed out and distinctly claimed in the concluding portion of this specification. The invention, however, both as to its organization and operation, together with further objects and advantages thereof may best be appreciated by reference to the following detailed description taken in conjunction with the drawings, wherein:

FIG. 3 is a schematic diagram of a second embodiment according to the invention; and FIG. 4 is a schematic diagram of a third embodiment of the invention.

DETAILED DESCRIPTION OF THE PREFERRED EMBODIMENT

The invention provides a photosensitive switch 10 connected to an AC power supply 11 through line terminal L and a neutral terminal N. Switch 10 is connected to a load through load terminal LD such as a street lamp 12, and includes control means arranged to turn the load on or off in response to the ambient light level.

Figure 2:
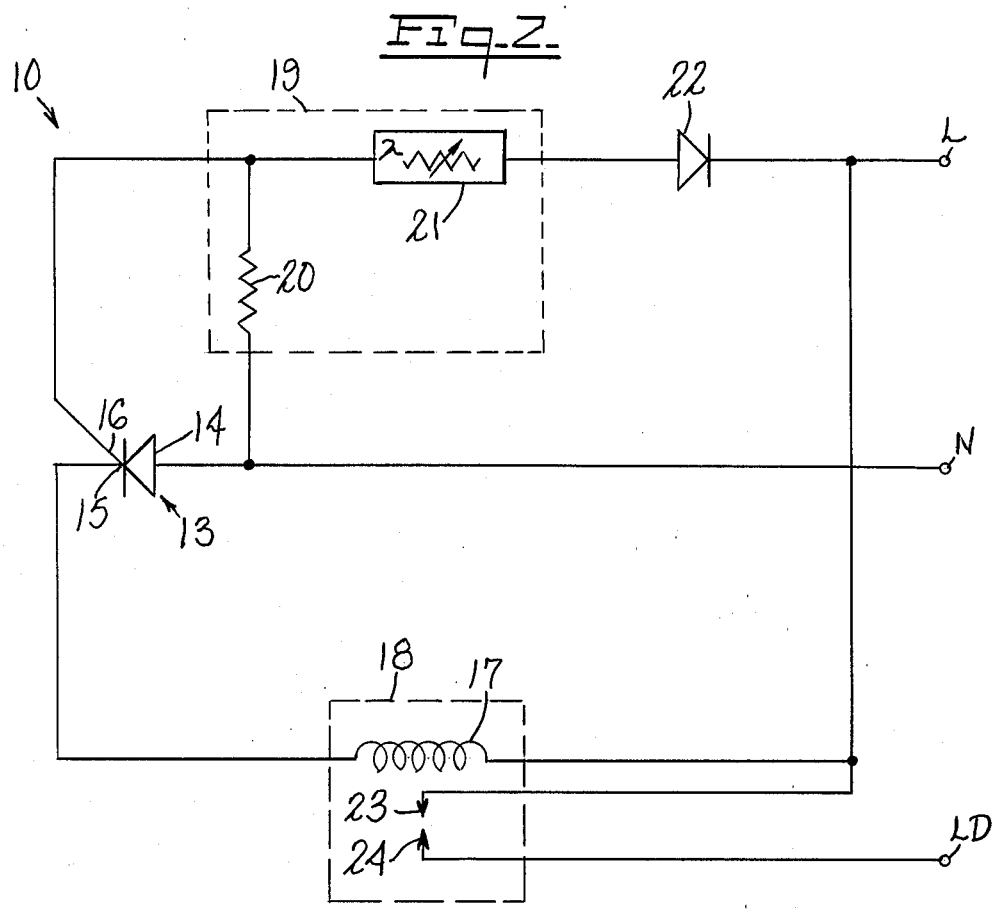
FIG. 2 is a schematic diagram of a switch according to the invention.
Figure 1:
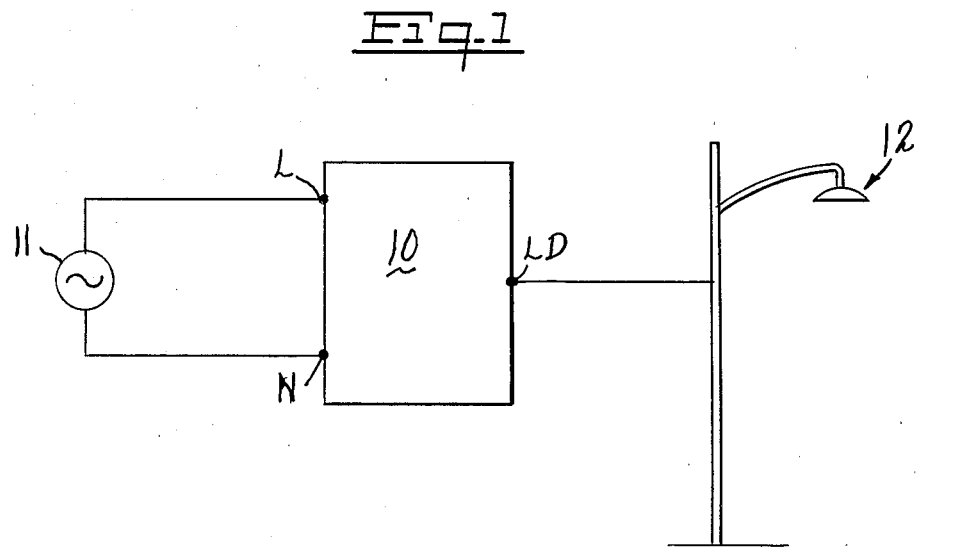
FIG. 1 is a diagram schematically showing a switch according to the invention in conjunction with a load and power supply.

As exemplified in FIG. 2, switch 10 includes a silicon controlled rectifier (SCR) 13, having an anode 14, a cathode 15 and a gate 16. The anode 14 is connected to the neutral line of power supply 11 at terminal N. Cathode 15 is connected to a heater 17 in a thermal relay 18.

Switch 10 further includes a voltage divider network 19 comprising a fixed resistor 20 and a photosensitive resistor 21. A diode 22 is connected in series with photosensitive resistor 21 in that leg of the voltage divider 19. Voltage divider 19 is connected between terminal N and terminal L. Diode 22 is poled with its anode towards the photosensitive resistor and the cathode towards terminal L.

Gate 16 of SCR 13 is connected to voltage divider 19 at the junction between fixed resistor 20 and photosensitive resistor 21.

Thermal relay 18 includes a pair of normally-open contacts 23 and 24, actuable by heater 17. Contact 23 is electrically connected to terminal L and contact 24 is connected to the load terminal LD.

Photosensitive resistor 21 is chosen having a characteristic such that as the luminous flux incident thereon increases, the resistance thereof decreases. Therefore, during the day, the resistance of resistor 21 is at its lowest whereas in the evening, its resistance increases and is at a maximum at night. Furthermore, the ratio of resistance of the fixed resistor 20 to the photosensitive resistor 21 is chosen such that the threshold voltage is exceeded at night, actuating the SCR gate, and is insufficient during the day to actuate the gate.

The thermal relay 18 is chosen so that the contacts 23 and 24 are normally open when heater 17 is not actuated. Contacts 23 and 24 close when heater 17 is thermally actuated, when current flows therethrough.

In operation, during the half-cycle in which the voltage at terminal L is positive with respect to terminal N, the entire voltage drop appears across diode 22 and SCR 13 is prevented from actuating. No current flows through heater 17, and contacts 23 and 24 of relay 18 are prevented from closing. During the half-cycle in which terminal N is positive with respect to terminal L, resistors 20 and 21 act as a voltage divider. During the day, when the resistance of resistor 21 is low, the potential at gate 16 fails to reach a level sufficient to trigger the SCR. Therefore, during the day, the SCR is held off both when terminal L is positive with respect to terminal N and when terminal N is positive with respect to terminal L.

However, at night when light incident on resistor 21 decreases, its resistance increases. When terminal N is positive with respect to terminal L, the gate is actuated, triggering SCR 13 and allowing current to flow through heater 17 and thermal relay 18. The contacts 23 and 24 are closed, supplying current to the load terminal.

When terminal L is positive with respect to terminal N, the SCR is held off. However, the contacts 23 and 24 of thermal relay 18 are held closed by the residual heat in the thermal relay and the load terminal LD is held on.

A second embodiment of the invention is exemplified in FIG. 3 comprising a switch 25 similar to switch 10, and further including a variable resistor 26 in the leg of the voltage divider including the photosensitive resistor 21. Variable resistor 26 varies the operating point of the voltage on gate 16 by varying the ratio of the resistance in the two legs of the voltage divider. By increasing the resistance of resistor 26, the SCR is actuated at a threshold higher light level corresponding to a commensurately lower resistance required of photosensitive resistor 21. Similarly, by decreasing the resistance of variable resistor 26, the SCR is actuated only at a threshold lower light level corresponding to a commensurately higher resistance required of photosensitive resistor 21.

With reference to FIG. 4, a third embodiment is exemplified providing a switch 27 having SCR 13, fixed resistor 20 and thermal relay 18 in the configuration described with respect to FIG. 2. Switch 27 further includes a fuse 28 connected to the junction between SCR anode 14 and resistor 20 and to neutral terminal N. A photosensitive resistor 29 and variable resistor 30 are connected between the other side of resistor 20 and line terminal L, and a diode 31 is connected across them with anode 32 connected towards the line terminal and cathode 33 connected towards resistor 20.

Switch 27 normally operates in the manner described with respect to FIG. 2. Fuse 28 and diode 31 serve to turn the switch off when SCR is shorted. In such a situation, during the half-cycle that L is positive with respect to N, current will flow through diode 31, through the shorted gate of SCR 13, and blow the fuse 28.

Variable resistor 30 is shown by way of illustration only, and may be deleted. It serves to vary the operating sensitivity of switch 27 in a manner similar to the operation of variable resistor 26 in switch 25, shown in FIG. 3.

It may thus be seen that the objects of the invention set forth as well as those made apparent from the foregoing description are efficiently attained. While preferred embodiments of the invention have been set forth for purposes of disclosure, modification to the disclosed embodiments of the invention as well as other embodiments thereof may occur to those skilled in the art. Accordingly, the appended claims are intended to cover all embodiments of the invention and modifications to the disclosed embodiments which do not depart from the spirit and scope of the invention.

I claim:

1. A photosensitive switch having a line terminal and a neutral terminal adapted to be connected to a power supply and a load terminal adapted to be connected to a load to control the load in response to the ambient light level comprising:

a thermal relay having a heater and normally-open contact points, one side of said heater and one of said contact points being connected to said line terminal;

an SCR having its anode connected to the neutral terminal, its cathode connected to the other side of the heater, and further having a gate;

a voltage divider comprising a fixed resistor between the SCR anode and the SCR gate and a photosensitive resistor between the SCR gate and the line terminal, said photosensitive resistor having a relatively low resistance at high light levels and a relatively high resistance at low light levels, the ratio of resistance of the fixed resistor to the photosensitive resistor being such that the SCR is energized below a preselected light level, and is maintained off at light levels above said preselected level; and a fuse connected at one end thereof to the junction between the SCR anode and the fixed resistor and at the other end thereof to the neutral terminal, and a diode across the photosensitive resistor.

* * * * *